US011501957B2

(12) United States Patent
Krishna et al.

(10) Patent No.: US 11,501,957 B2
(45) Date of Patent: Nov. 15, 2022

(54) PEDESTAL SUPPORT DESIGN FOR PRECISE CHAMBER MATCHING AND PROCESS CONTROL

(71) Applicant: Applied Materials, Inc., Santa Clara, CA (US)

(72) Inventors: Gopu Krishna, Karnataka (IN); Alexander S. Polyak, Palm Coast, FL (US); Sanjeev Baluja, Campbell, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 148 days.

(21) Appl. No.: 17/011,977

(22) Filed: Sep. 3, 2020

(65) Prior Publication Data

US 2022/0068608 A1 Mar. 3, 2022

(51) Int. Cl.
*H01J 37/32* (2006.01)

(52) U.S. Cl.
CPC .. *H01J 37/32513* (2013.01); *H01J 37/32715* (2013.01); *H01J 2237/166* (2013.01); *H01J 2237/20214* (2013.01)

(58) Field of Classification Search
CPC ....... H01J 2237/166; H01J 2237/20214; H01J 37/32513; H01J 37/32715; H01L 21/67167; H01L 21/68742; H01L 21/68764; H01L 21/68771; H01L 21/68792; H01L 21/6719
USPC ............ 156/345.22, 345.23, 345.51, 345.55; 438/706, 710, 714
See application file for complete search history.

(56) References Cited

U.S. PATENT DOCUMENTS

| | | | |
|---|---|---|---|
| 8,033,772 B2 | 10/2011 | Kurita et al. | |
| 8,827,617 B2 | 9/2014 | Hofmeister et al. | |
| 9,315,900 B2 | 4/2016 | Johnston et al. | |
| 10,679,827 B2* | 6/2020 | Krishna | H01J 37/32724 |
| 2007/0166133 A1 | 7/2007 | Lee et al. | |
| 2009/0200269 A1* | 8/2009 | Kadkhodayan | H01L 21/67069 427/523 |
| 2011/0070740 A1 | 3/2011 | Bettencourt et al. | |
| 2012/0128336 A1* | 5/2012 | Kato | H01L 21/68785 392/416 |
| 2012/0291709 A1 | 11/2012 | Smith et al. | |
| 2020/0090978 A1 | 3/2020 | Aubuchon et al. | |

FOREIGN PATENT DOCUMENTS

| | | |
|---|---|---|
| CN | 106702353 B | 3/2019 |
| WO | 2005083153 A1 | 9/2005 |

OTHER PUBLICATIONS

PCT International Search Report and Written Opinion in PCT/US2021/049000 dated Dec. 28, 2021, 12 pages.
Machine Translation of Description and Claims for WO2005083153A1.

* cited by examiner

*Primary Examiner* — Lan Vinh
(74) *Attorney, Agent, or Firm* — Servilla Whitney LLC (57) ABSTRACT

Process chambers and methods for calibrating components of a processing chamber while the chamber volume is under vacuum are described. The process chamber includes a motor shaft connected to the process chamber with a plurality of motor bolts. A support plate is positioned under the chamber floor to accommodate for deflection of the chamber floor due to vacuum conditions within the chamber volume. A bellows assembly extending from the chamber floor to the support plate maintains vacuum conditions within the chamber.

17 Claims, 9 Drawing Sheets

PEDESTAL SUPPORT DESIGN FOR PRECISE CHAMBER MATCHING AND PROCESS CONTROL

TECHNICAL FIELD

Embodiments of the disclosure generally relate to pedestals for batch processing chamber. In particular, embodiments of the disclosure are directed to pedestal supports for batch processing chambers that allow for improved chamber matching precision.

BACKGROUND

In some chamber designs for atomic layer deposition (ALD) or chemical vapor deposition (CVD) processing, precursors and gases are delivered to a large substrate support or multiple substrate support surfaces through multiple gas distribution plates at the same time. The gas distribution plates are spaced from the substrate surfaces, or vice versa, forming one or more operational gaps. Such chambers can be highly sensitive to the consistency and uniformity of the gaps between different process stations and over time as the chamber is used. With small gaps (e.g., less than 5 mm) for some multi-station deposition systems, the processes performed in the separate stations can be highly susceptible to small gap deviations.

Many processing systems and processing tools operate with very tight space requirements. For example, a multi-substrate ALD chamber can process with gaps less than 5 mm between the substrate surface and the gas distribution system. These small spaces minimize chemistry consumption by reducing process volume, minimize ALD cycle time and purge time and maximize throughput.

The substrates supports for some processing chambers use a motor assembly with a shaft and at least one support surface. The shaft extends through a bottom of the processing chamber and maintains the support surfaces. Runout from the motor can cause precession variation; a change in the orientation of the rotational axis of the rotating shaft. This change in rotational axis orientation can result in rotating gap discrepancies.

Further, large volume batch processing chambers often suffer from chamber floor deflection as a result of the low pressure environment within the processing chamber. The chamber floor deflection causes repeatability issues for chamber matching when the substrate actuator or motor assembly is directly mounted on the chamber floor.

Chamber calibration activities including process spacing and pedestal leveling processes are generally performed in atmospheric conditions. Any changes to the spacing and leveling needs to be eliminated, especially in process chambers where substrates are continuously moved between process stations with a small spacing.

Therefore, there is a need in the art for apparatus and methods for calibrating in both atmospheric and low pressure conditions

SUMMARY

One or more embodiments of the disclosure are directed to a process chamber comprising a chamber body, a support plate, a support post, a motor and a bellows. The chamber body has a chamber floor and sidewalls defining an interior volume, the chamber floor having an top surface and an bottom surface defining a thickness of the chamber floor and an opening through the thickness of the chamber floor. The support plate has a top surface and a bottom surface defining a support plate thickness, the top surface of the support plate in contact with the bottom surface of the chamber floor, the support plate having an opening extending through the support plate thickness and aligned with the opening through the thickness of the chamber floor. The support post extends through the support plate and the chamber floor, the support post having a rotational axis, a bottom end outside the interior volume and a top end inside the interior volume of the chamber body. The motor is connected to the bottom surface of the support plate and configured to rotate the support post around the rotational axis and move the support post along a length of the rotational axis and the bellows is configured to allow the support post to extend therethrough and separate a vacuum environment in the interior volume from an atmospheric environment outside the chamber body while allowing movement of the chamber floor.

Additional embodiments of the disclosure are directed to a processing method comprising aligning a top surface of one or more substrate support surfaces located within a chamber volume with a chamber lid to establish a process gap, the one or more substrate support surfaces connected to a support post that extends through an opening in the a chamber floor and an opening in a support plate attached to a bottom surface of the chamber floor; and [0001] creating a vacuum environment within the chamber volume causing a chamber floor to deflect toward the chamber volume while maintaining the process gap.

Additional embodiments of the disclosure are directed to a processing chamber comprising a chamber body, a support plate, a support post, a motor, a bellows and a plurality of processing stations. The chamber body has a chamber floor and sidewalls defining an interior volume, the chamber floor having an top surface and an bottom surface defining a thickness of the chamber floor and an opening through the thickness of the chamber floor. The support plate has a top surface and a bottom surface defining a support plate thickness, the top surface of the support plate in contact with the bottom surface of the chamber floor, the support plate having an opening extending through the support plate thickness and aligned with the opening through the thickness of the chamber floor. A support post extends through the support plate and the chamber floor, the support post having a rotational axis, a bottom end outside the interior volume and a top end inside the interior volume of the chamber body. The motor is connected to the bottom surface of the support plate and configured to rotate the support post around the rotational axis and move the support post along a length of the rotational axis and the bellows is configured to allow the support post to extend therethrough and separate a vacuum environment in the interior volume from an atmospheric environment outside the chamber body while allowing movement of the chamber floor. The plurality of process stations is located in the interior volume of the chamber body, the plurality of process stations being configured to perform one or more deposition processes.

The bellows is configured to allow the support post to extend therethrough and separate the vacuum environment in the interior volume from an atmospheric environment outside the chamber body while allowing movement of the chamber floor. The bellows is configured to allow the chamber floor to deflect under vacuum without affecting alignment of the support post. The at least one alignment pin is configured to maintain positioning of the support plate relative to the chamber floor, each of the at least one alignment pin being disposed within an aperture formed in a top surface of the support plate and an aperture formed in a bottom surface of the chamber floor. When the interior volume is under the vacuum environment, a center portion of the chamber floor deflects toward the interior volume increasing a gap between a bottom surface of the chamber floor and a top surface of the support plate within the center portion, the gap remaining at atmospheric conditions

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface, or with a film formed on the substrate surface.

One or more embodiments of the disclosure advantageously provide for a support plate for a pedestal assembly configured to prevent the pedestal assembly from moving when a chamber is under vacuum, maintaining the leveling calibration and process spacing. Some embodiments provide for a support plate for tightly controlled landing pads for an indexer motor for narrow calibration windows. Further embodiments provide for a bellows assembly which separates vacuum environment within the chamber from atmosphere.

Figure 1:
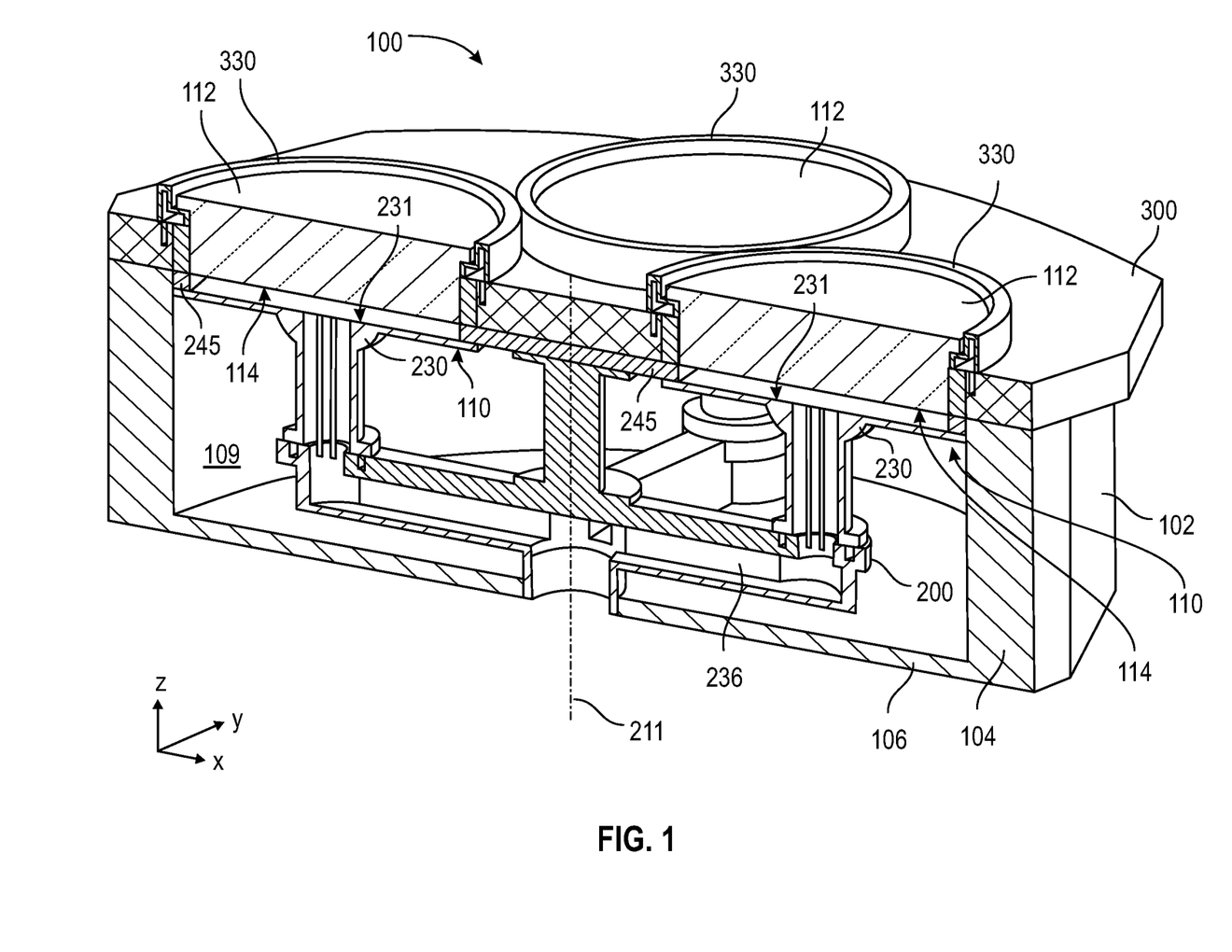
FIG. 1 shows a cross-sectional isometric view of a processing chamber in accordance with one or more embodiments of the disclosure.
Figure 2:
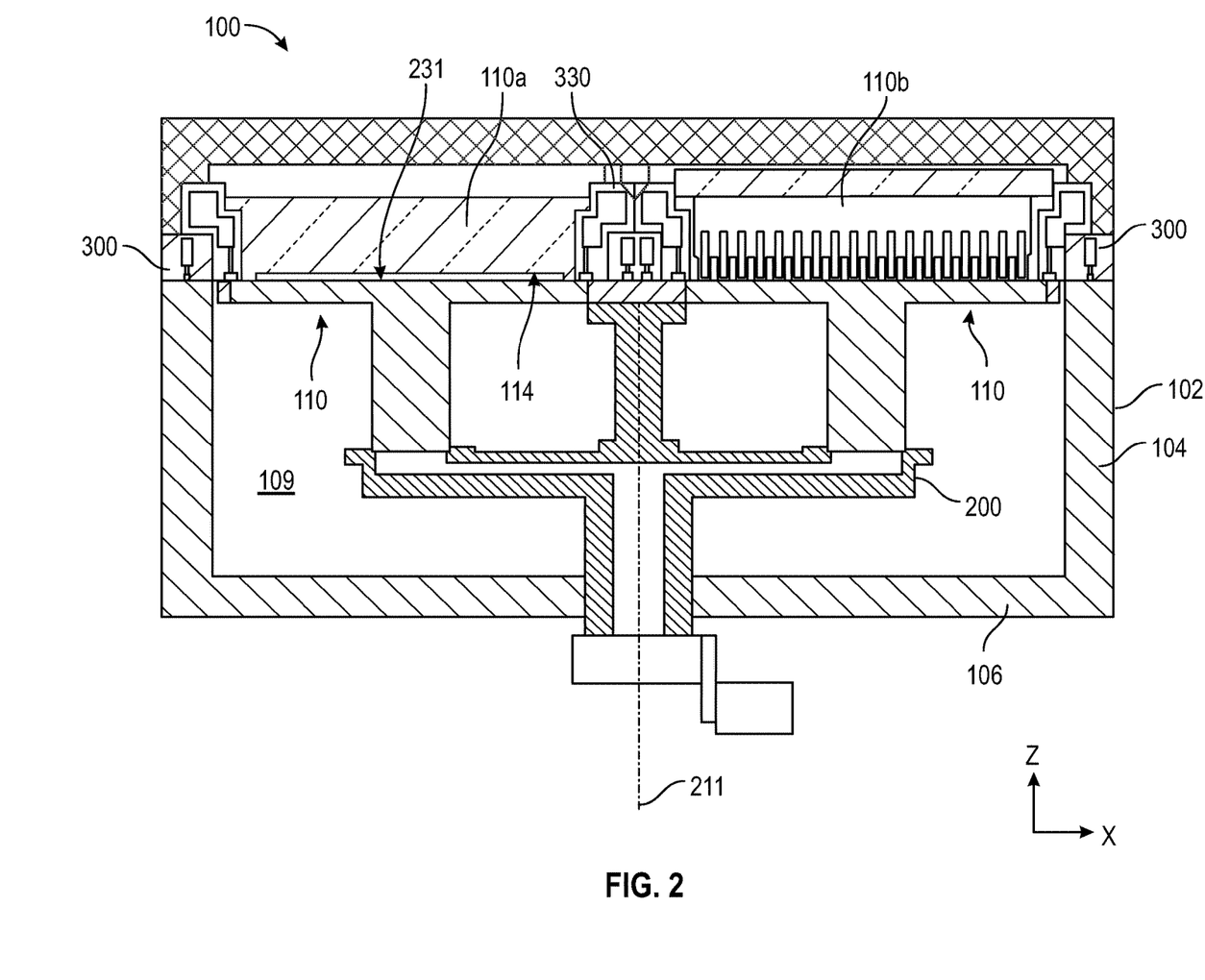
FIG. 2 shows a cross-sectional view of a processing chamber in accordance with one or more embodiments of the disclosure.
Figure 3A:
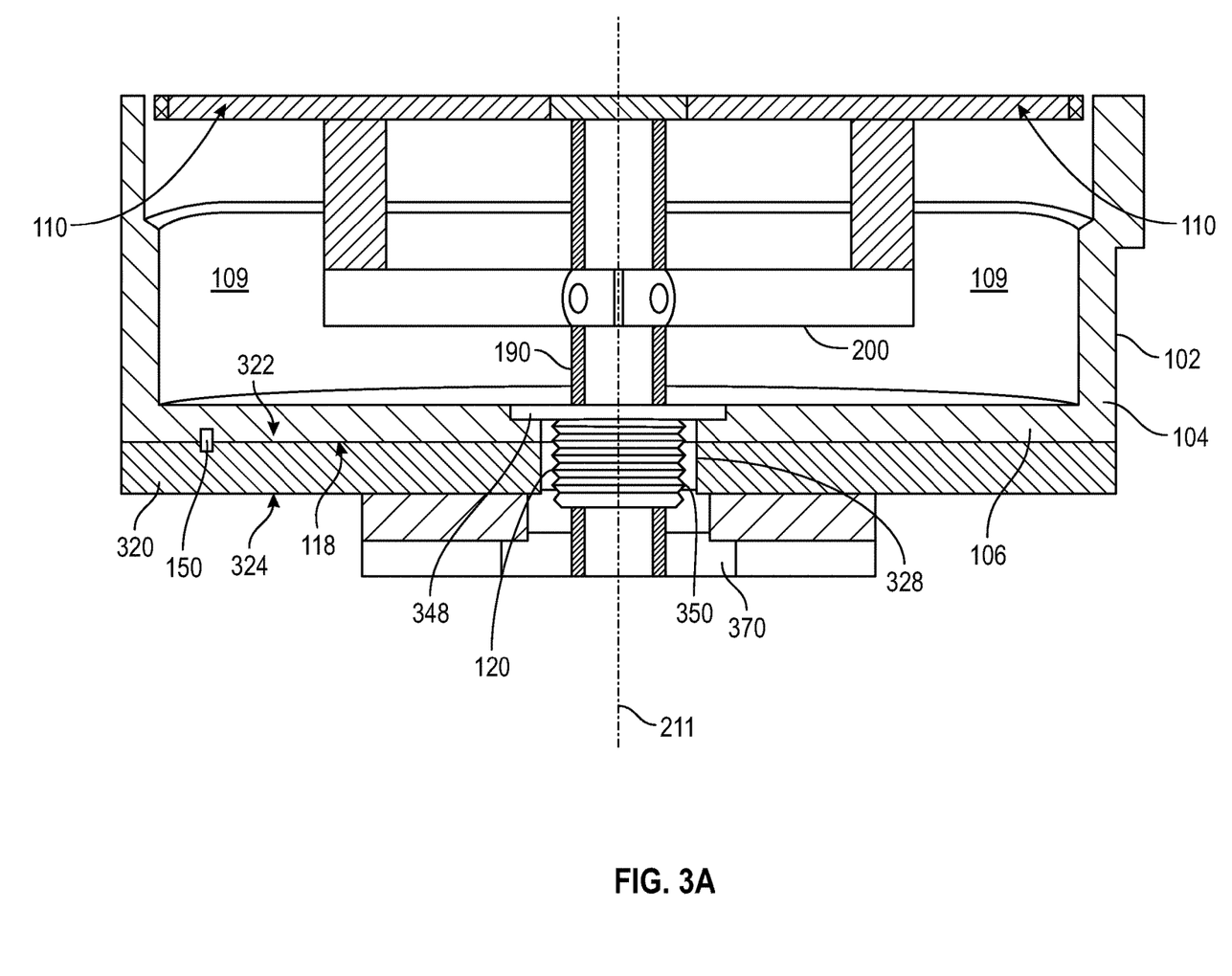
FIG. 3A shows a cross-sectional view of a processing chamber in accordance with one or more embodiments of the disclosure.
Figure 3B:
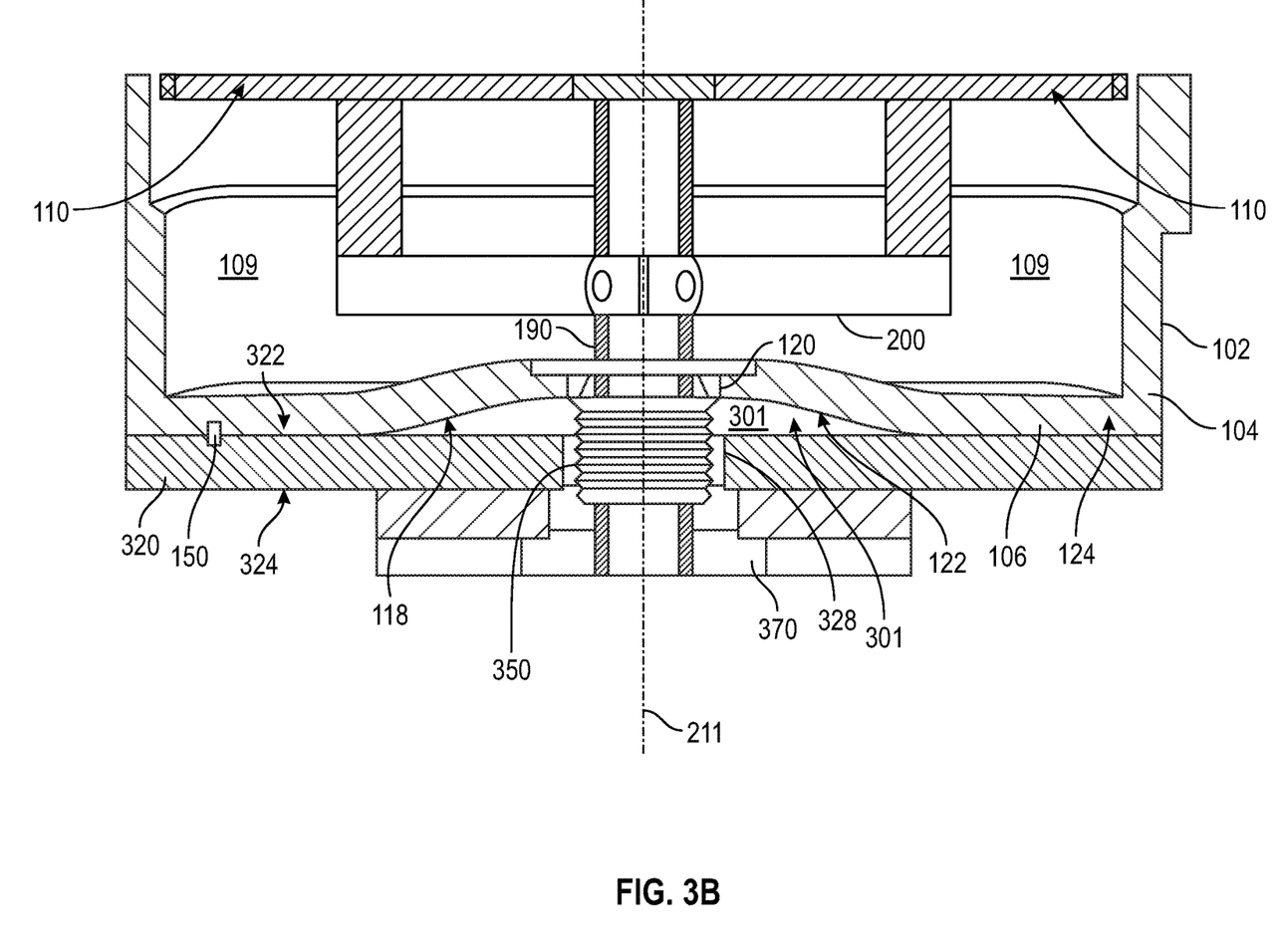
FIG. 3B shows a cross-sectional view of a processing chamber in accordance with one or more embodiments of the disclosure.

The disclosure provides substrate supports for use with single substrate or multi-substrate (also referred to as batch) process chambers. FIGS. 1 and 2 illustrate a processing chamber 100 in accordance with one or more embodiment of the disclosure. FIGS. 3A and 3B illustrate the processing chamber 100 having a support plate 320 and a bellows assembly 340 for mitigating effects of deflection of the processing chamber 100 due to a vacuum environment. FIG. 1 shows the processing chamber 100 illustrated as a cross-sectional isometric view in accordance with one or more embodiment of the disclosure. FIG. 2 shows a processing chamber 100 in cross-section according to one or more embodiment of the disclosure. FIG. 3A shows the processing chamber 100 in cross-section in accordance with one or more embodiment of the disclosure. FIG. 3B shows the processing chamber 100 under vacuum in cross-section according to one or more embodiment of the disclosure. Accordingly, some embodiments of the disclosure are directed to processing chambers 100 that incorporate a substrate support 200, a support plate 320 and a bellows assembly 340.

The processing chamber 100 has a housing 102 with sidewalls 104 and a chamber floor 106. The housing 102 along with the chamber lid 300 define a processing volume 109, also referred to as an interior volume 109.

The processing station 110 illustrated comprises three main components: the chamber lid 300 (also called a lid), a pump/purge insert 330 and a gas injector 112. The processing chamber 100 further includes a plurality of processing stations 110. The processing stations 110 are located in the interior volume 109 of the housing 102 and are positioned in a circular arrangement around the rotational axis 211 of the substrate support 200. Each processing station 110 comprises a gas distribution plate 112 (also referred to as a gas injector) having a front surface 114. In some embodiments, the front surfaces 114 of each of the gas injectors 112 are substantially coplanar. The processing stations 110 are defined as a region in which processing can occur. For example, in some embodiments, a processing station 110 is defined as a region bounded by the support surface 231 of the substrate support 200, as described below, and the front surface 114 of the gas injectors 112. In the illustrated embodiment, heaters 230 act as the substrate support surfaces and form part of the substrate support 200.

The processing stations 110 can be configured to perform any suitable process and provide any suitable process conditions. The type of gas distribution plate 112 used will depend on, for example, the type of process being performed and the type of showerhead or gas injector. For example, a processing station 110 configured to operate as an atomic layer deposition apparatus may have a showerhead or vortex type gas injector. Whereas, a processing station 110 configured to operate as a plasma station may have one or more electrode and/or grounded plate configuration to generate a plasma while allowing a plasma gas to flow toward the substrate. The embodiment illustrated in FIG. 2 has a different type of processing station 110 on the left side (processing station 110a) of the drawing than on the right side (processing station 110b) of the drawing. Suitable processing stations 110 include, but are not limited to, thermal processing stations, microwave plasma, three-electrode CCP, ICP, parallel plate CCP, UV exposure, laser processing, pumping chambers, annealing stations and metrology stations.

As shown in FIGS. 3A and 3B, due to a low pressure environment within the interior volume 109, the chamber floor 106 can deflect inwardly towards the interior volume 109. The embodiment illustrated in the Figures shows a symmetrical deflection centered on the support post 190, or opening in the chamber floor 106 for the support post 190. The skilled artisan will recognize that this is merely representative of possible deflection arrangements. In some embodiments the chamber floor 106 deflects in a non-symmetrical manner so that a component attached to the chamber floor or the bottom of the chamber housing becomes tilted. The deflection of the chamber floor 106 causes repeatability issues for chamber matching in embodiments where a support post, wafer actuator or pedestal is directly mounted on the chamber floor.

FIGS. 3A and 3B illustrate an embodiment where the processing chamber 100 further incudes a bellows assembly 340 for mounting the a bottom end 192 of the support post 190 outside of the interior volume 109 while still maintaining low pressure conditions within the interior volume 109. The chamber floor 106 has a top surface 116 and a bottom surface 118 defining a thickness of the chamber floor 106. The chamber floor 106 further includes an opening 120 to allow the support post 190 to pass therethrough. In some embodiments the opening 120 in the chamber floor 106 is concentrically positioned on the rotational axis 211 of the substrate support 200. Deflection of the chamber floor 106 generally occurs at a center portion 122 of the chamber floor. Due to the decreased pressure in the interior volume 109, the chamber floor 106 deflects inwardly toward the interior volume 109. The bellows assembly 340 is configured to allow the chamber floor 106 to deflect under vacuum without affecting alignment of the support post 190, as described further below.

A support plate 320 is connected to the bottom surface 118 of the chamber floor 106. The support plate 320 has a top surface 322 and a bottom surface 324 defining a support plate thickness T. The top surface 322 is in contact with the bottom surface 118 of the chamber floor 106. In some embodiments, as explained in further detail below and shown in FIG. 3B, a gap 301 may exist between the top surface 322 of the support plate 320 and the bottom surface 118. The gap 301 may increase in vertical direction as a result of low atmospheric conditions existing within the interior volume 109. The gap 301 may be greater at the central portion 122 of the chamber floor 106 relative to an outer peripheral portion 124 of the chamber floor 106.

In some embodiments, the outer peripheral portion 124 of the chamber floor 106 is substantially unaffected by deflection when the interior volume 109 is under a vacuum environment. As used in this manner, the term "substantially unaffected" means that the outer 5%, 10%, 15%, 20% or 25% of the chamber floor 106 does not move relative to the support plate 320 by more than 0.5 mm. In some embodiments, the outer peripheral portion 124 is defined as the outer 25% of a distance from a center of the opening in the chamber floor 106 to the sidewalls 104.

The support plate 320 further includes an opening 328 extending through the support plate thickness. The opening 328 of the support plate 320 is aligned with the opening 120 of the chamber floor 106, the opening 120 of the chamber floor 106 being concentrically positioned on the rotational axis 211 of the substrate support 200. In some embodiments, the opening 120 of the chamber floor 106 and the opening 120 of the chamber floor 106 are circular having substantially same diameters.

Figure 4A:
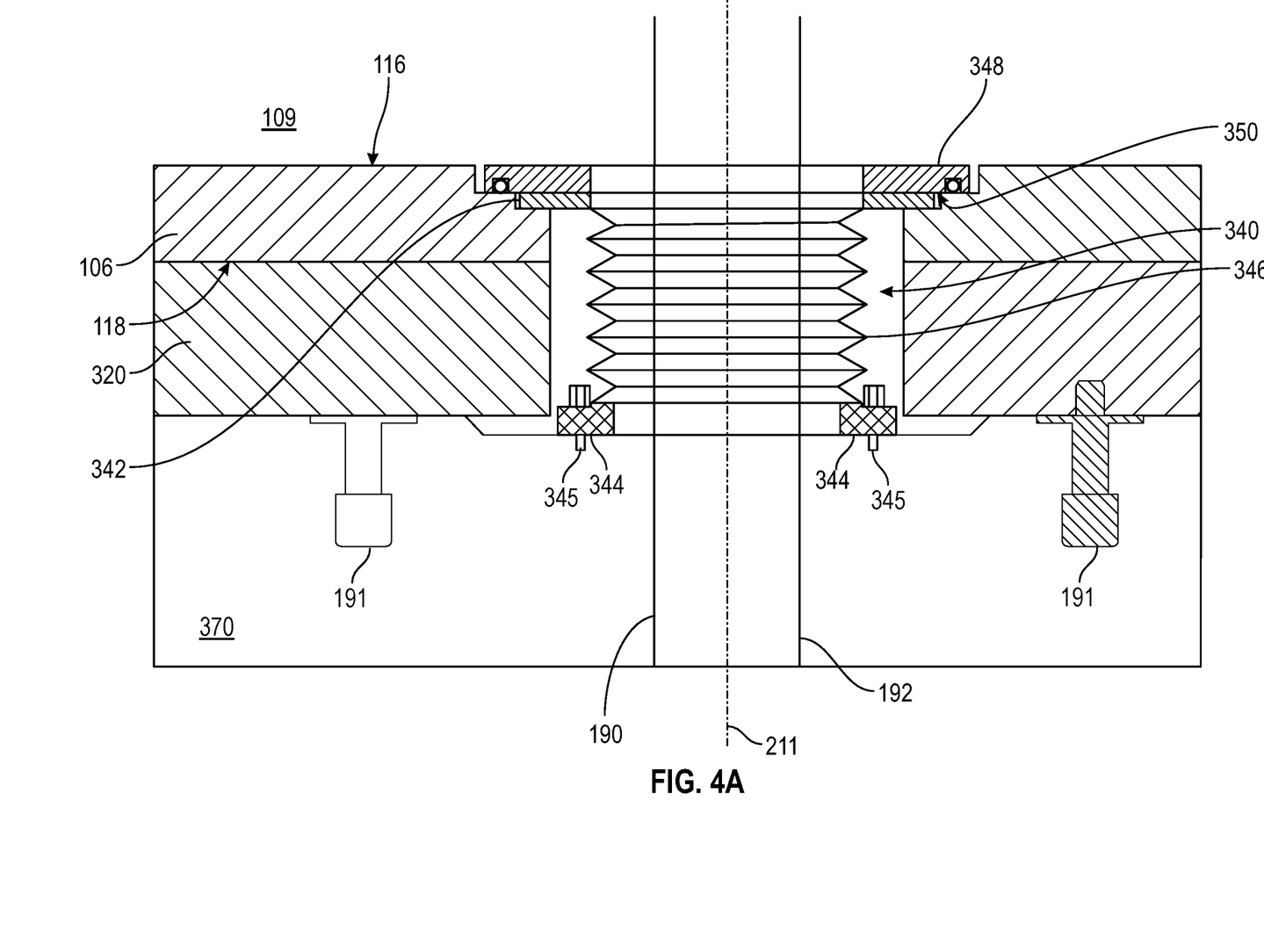
FIG. 4A shows a detailed view of a bellows assembly in accordance with one or more embodiments of the disclosure.
Figure 4B:
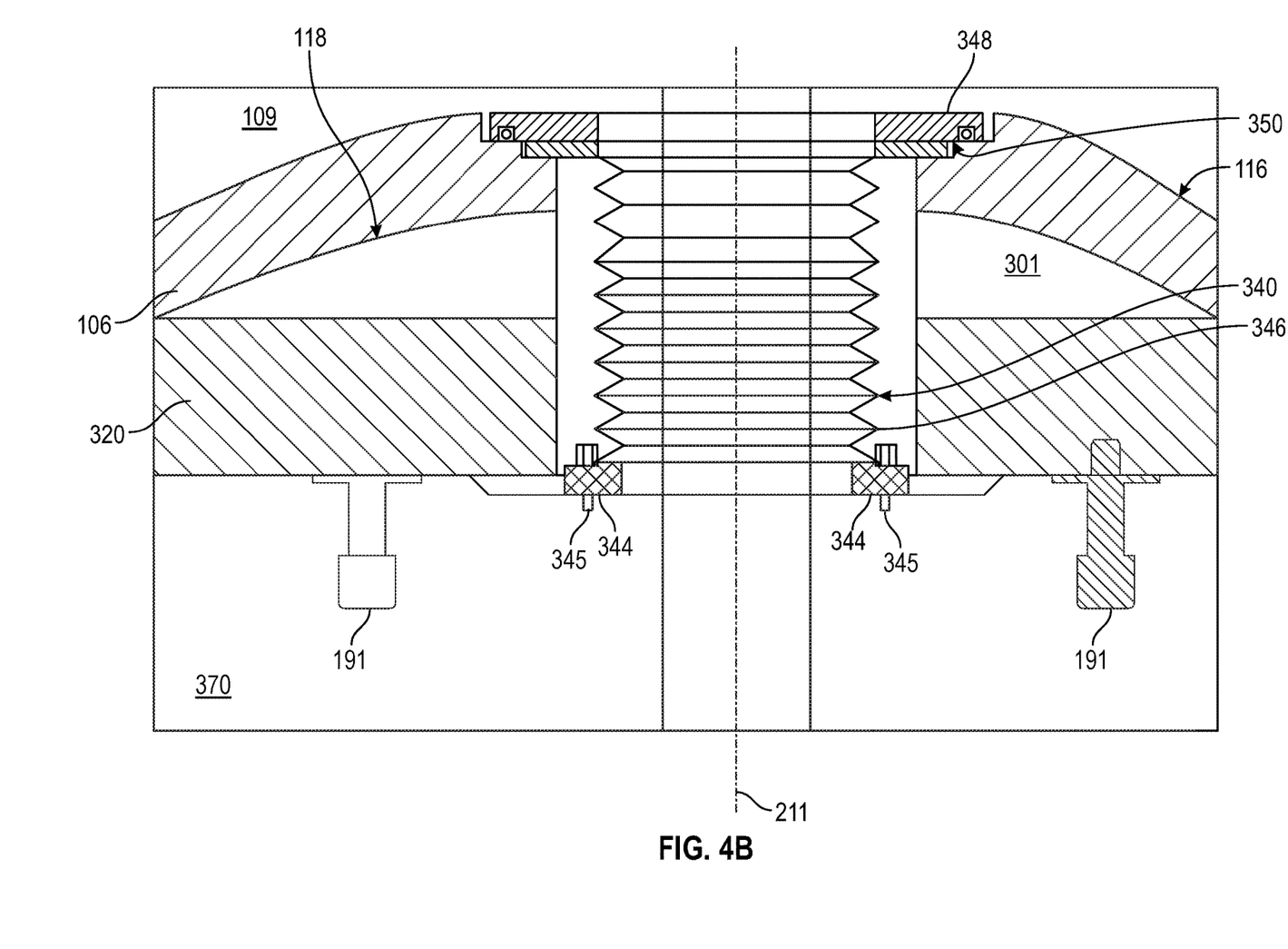
FIG. 4B shows a detailed view of a bellows assembly in accordance with one or more embodiments of the disclosure.

As shown in FIGS. 4A and 4B, the bellows assembly 340 is configured to expand or contract to account for chamber floor 106 defections. FIG. 4A illustrates the bellows assembly 340 in a retracted state in which deflection of the chamber floor has not occurred. FIG. 4B illustrates the bellows assembly 340 in an extended state in which the chamber floor 106 is deflecting due to low atmosphere or vacuum environment within the interior volume 109 and the gap 301 is formed between the chamber floor 106 and the support plate 320. In some embodiments, the bellows assembly 340 is configured for mounting the bottom end 192 of the support post 190 outside of the interior volume 109 while still maintaining low pressure conditions within the interior volume 109. The bellows assembly 340 separates a vacuum environment in the interior volume 109 from an atmospheric environment outside the chamber body while allowing movement of the chamber floor 106. The atmospheric environment exists outside of the chamber body and within the gap 301.

The bellows assembly 340 comprises a top plate 342, a bottom plate 344 and an expandable bellows 346 between the top plate 342 and the bottom plate 344. In some embodiments, the bottom plate 344 is in contact with the motor 370. At least two fasteners 345 extend through mounting holes of the motor 370, securing the motor 370 to the bottom plate 344. In some embodiments, the top plate 342 is connected to the chamber floor 106 creating a fluid-tight seal able to maintain vacuum within the interior volume 109. In some embodiments, a top flange 348 having a bottom surface 350 is connected to the top plate 342 and the chamber floor 106 creating a fluid-tight seal able to maintain vacuum within the interior volume 109. In some embodiments, the top flange 348 has a greater surface area than the top plate 342. In some embodiments, the top flange 348 has a larger diameter than the top plate 342. In some embodiments the top flange 348 has an outer edge that is further from the support post than an outer edge of the top plate 342. In embodiments where the top flange 348 and the top plate 342 are circular bodies, the top flange 348 has a larger diameter than a diameter of the top plate 342 such that the top flange 348 completely covers the top plate 342. Each of the top plate 342, bottom plate 344 and the top flange 348 have an aperture sufficient to allow the support post 190 to pass through.

The support post 190 extends through an opening 328 in the support plate 320 and an opening 120 in the chamber floor 106. A bottom end 192 of the support post 190 is positioned outside the interior volume 109, a top end is positioned inside the interior volume 106 of the chamber body.

Figure 5:
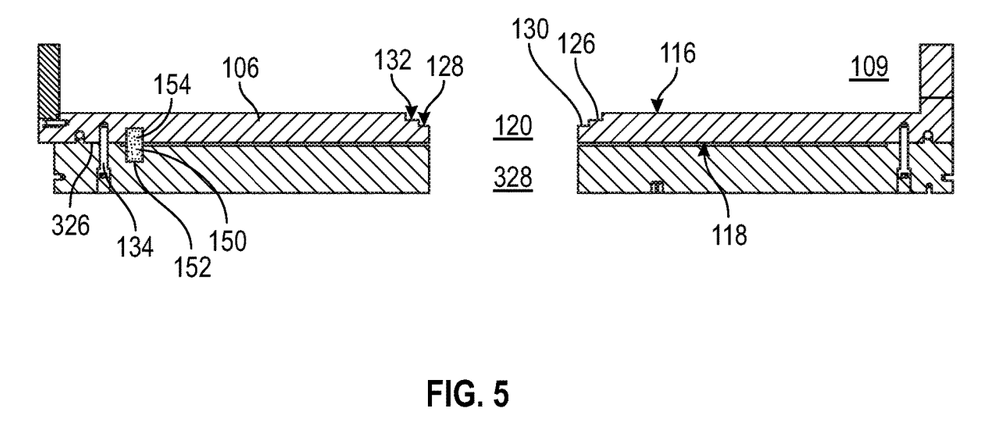
FIG. 5 shows a cross-sectional view of a processing chamber floor in accordance with one or more embodiments.
Figure 5A:
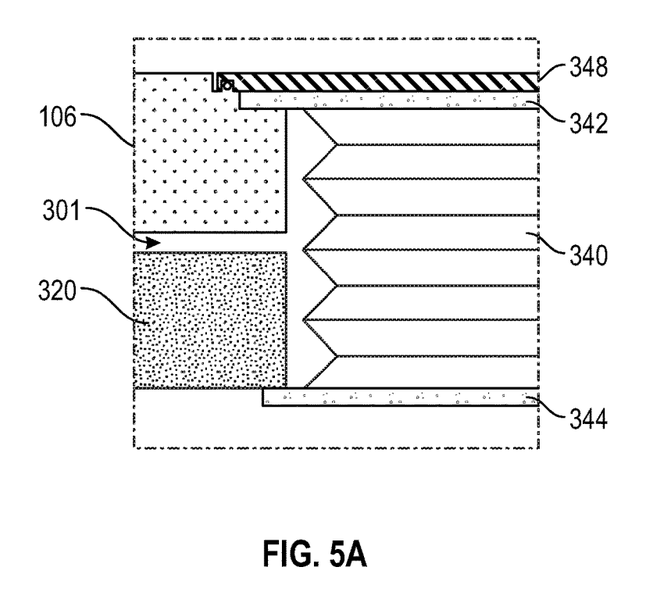
FIG. 5A shows a detailed cross-sectional view of a processing chamber floor in accordance with one or more embodiments.

In some embodiments, as shown in detail in FIGS. 5 and 5A, the chamber floor 106 comprises the top surface 116 having at least one ledge 126, 130 disposed concentrically around the opening 120, the at least one ledge 126, 130 extending a partial distance through the thickness of the chamber floor.

In some embodiments, at least one alignment pin 150 is configured to maintain positioning of the support plate 320 relative to the chamber floor 106. Each of the at least one alignment pins 150 is disposed within one or more of an aperture 152 formed in the top surface 322 of the support plate 320 or an aperture 154 formed in the bottom surface 118 of the chamber floor 106. In some embodiments, there are at least three alignment pins 150 spaced around the opening 120. In some embodiments, at least one alignment pin 150 is positioned within the outer peripheral portion 124 of the chamber floor 106.

Referring back to FIGS. 4A and 4B, in some embodiments, the motor 370 is connected to the bottom end 192 of the support post 190. The motor 370 is configured to rotate the support post 190 around the rotational axis 211 and move the support post 190 along a length of the rotational axis 211. In some embodiments, a top surface of the motor 370 is in contact with the bottom surface 324 of the support plate 320. At least two fasteners 191 extend through mounting holes of the motor 370, securing the motor 370 to the support plate 320.

Figure 6:
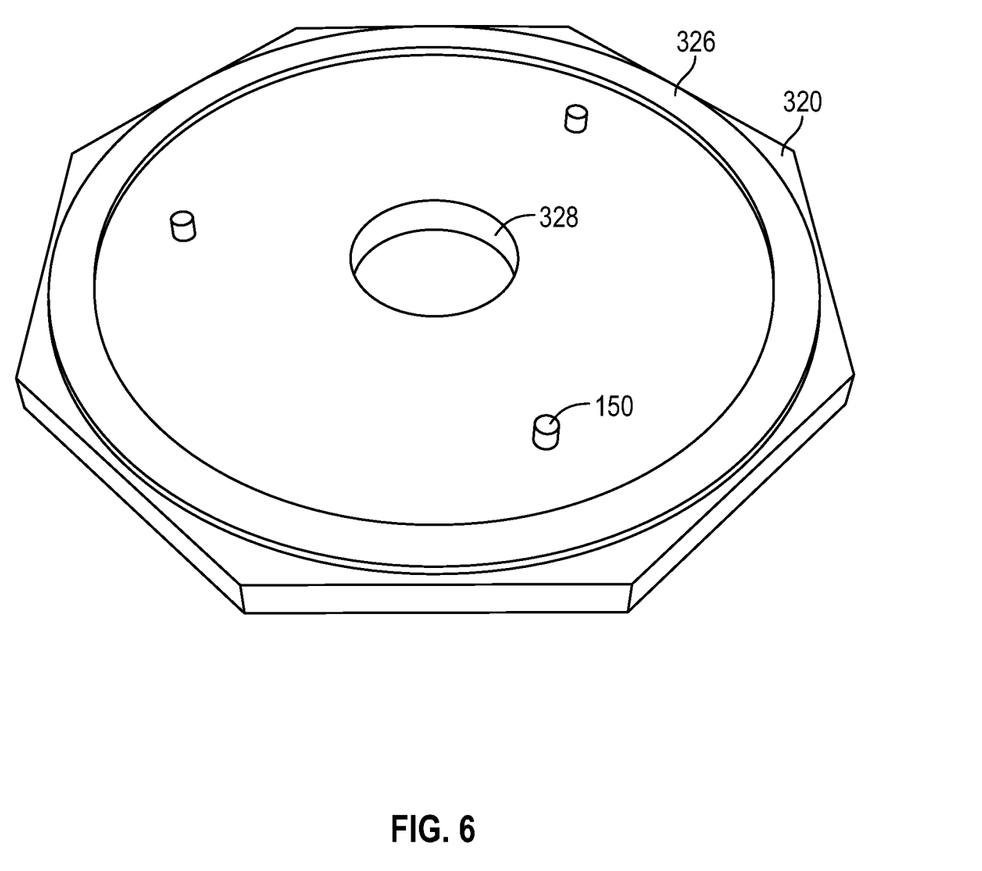
FIG. 6 shows a schematic view of a support plate in accordance with one or more embodiments of the disclosure.

As shown in FIG. 6, the support plate 320 has a polygonal shape. In some embodiments, the support plate 320 can be of any shape, including a disk or a rectangular plate. In some embodiments, the at least one alignment pin 150 is non-removably affixed to the top surface 322 of the support plate.

In some embodiments, the support plate 320 includes a raised protrusion 326 on the top surface 322 of the support plate 320. The raised protrusion 326 has a substantially circular shape and extends around a periphery of the support plate 320. When the support plate 320 is aligned with the chamber floor 106, the raised protrusion 326 is in contact with the bottom surface 118 of the chamber floor 106, thereby creating a clearance gap under the center portion 122 of the chamber floor 106. In some embodiments, the support plate 320 is affixed to the bottom surface 118 of the chamber floor 106 by fasteners 134 extending through apertures of the support plate 320, threading into threaded holes within the chamber floor 106. The fasteners are located within the outer portion 124 of the chamber floor 106.

Figure 7:
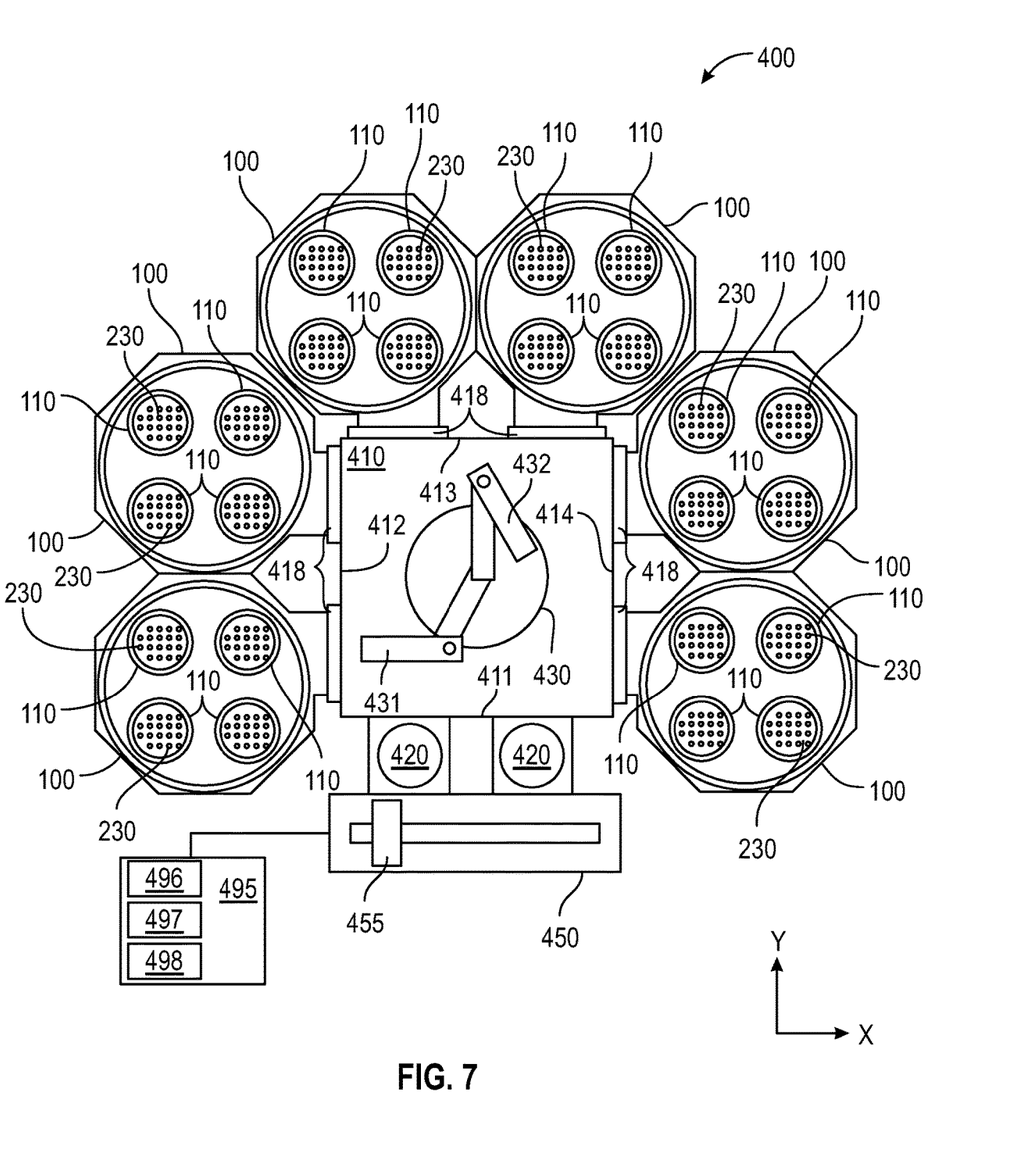
FIG. 7 shows a schematic representation of a processing platform in accordance with one or more embodiment of the disclosure.

FIG. 7 shows a processing platform 400 in accordance with one or more embodiment of the disclosure. The embodiment shown in FIG. 7 is merely representative of one possible configuration and should not be taken as limiting the scope of the disclosure. For example, in some embodiments, the processing platform 400 has a different numbers of one or more of the processing chambers 100, buffer stations 420 and/or robot 430 configurations than the illustrated embodiment.

The exemplary processing platform 400 includes a central transfer station 410 which has a plurality of sides 411, 412, 413, 414. The transfer station 410 shown has a first side 411, a second side 412, a third side 413 and a fourth side 414. Although four sides are shown, those skilled in the art will understand that there can be any suitable number of sides to the transfer station 410 depending on, for example, the overall configuration of the processing platform 400. In some embodiments, there the transfer station 410 has three sides, four sides, five sides, six sides, seven sides or eight sides.

The transfer station 410 has a robot 430 positioned therein. The robot 430 can be any suitable robot capable of moving a substrate during processing. In some embodiments, the robot 430 has a first arm 431 and a second arm 432. The first arm 431 and second arm 432 can be moved independently of the other arm. The first arm 431 and second arm 432 can move in the x-y plane and/or along the z-axis. In some embodiments, the robot 430 includes a third arm (not shown) or a fourth arm (not shown). Each of the arms can move independently of other arms.

The embodiment illustrated includes six processing chambers 100 with two connected to each of the second side 412, third side 413 and fourth side 414 of the central transfer station 410. Each of the processing chambers 100 can be configured to perform different processes.

The processing platform 400 can also include one or more buffer station 420 connected to the first side 411 of the central transfer station 410. The buffer stations 420 can perform the same or different functions. For example, the buffer stations may hold a cassette of substrates which are processed and returned to the original cassette, or one of the buffer stations may hold unprocessed substrates which are moved to the other buffer station after processing. In some embodiments, one or more of the buffer stations are configured to pre-treat, pre-heat or clean the substrates before and/or after processing.

The processing platform 400 may also include one or more slit valves 418 between the central transfer station 410 and any of the processing chambers 100. The slit valves 418 can open and close to isolate the interior volume within the processing chamber 100 from the environment within the central transfer station 410. For example, if the processing chamber will generate plasma during processing, it may be helpful to close the slit valve for that processing chamber to prevent stray plasma from damaging the robot in the transfer station.

The processing platform 400 can be connected to a factory interface 450 to allow substrates or cassettes of substrates to be loaded into the processing platform 400. A robot 455 within the factory interface 450 can be used to move the substrates or cassettes into and out of the buffer stations. The substrates or cassettes can be moved within the processing platform 400 by the robot 430 in the central transfer station 410. In some embodiments, the factory interface 450 is a transfer station of another cluster tool (i.e., another multiple chamber processing platform).

A controller 495 may be provided and coupled to various components of the processing platform 400 to control the operation thereof. The controller 495 can be a single controller that controls the entire processing platform 400, or multiple controllers that control individual portions of the processing platform 400. For example, the processing platform 400 of some embodiments comprises separate controllers for one or more of the individual processing chambers 100, central transfer station 410, factory interface 450 and/or robots 430.

In some embodiments, the processing chamber 100 further comprises a controller 495 connected to the plurality of substantially coplanar support surfaces 231 configured to control one or more of the first temperature or the second temperature. In one or more embodiments, the controller 495 controls a movement speed of the substrate support.

In some embodiments, the controller 495 includes a central processing unit (CPU) 496, a memory 497, and support circuits 498. The controller 495 may control the processing platform 400 directly, or via computers (or controllers) associated with particular process chamber and/or support system components.

The controller 495 may be one of any form of general-purpose computer processor that can be used in an industrial setting for controlling various chambers and sub-processors. The memory 497 or computer readable medium of the controller 495 may be one or more of readily available memory such as random access memory (RAM), read only memory (ROM), floppy disk, hard disk, optical storage media (e.g., compact disc or digital video disc), flash drive, or any other form of digital storage, local or remote. The memory 497 can retain an instruction set that is operable by the processor (CPU 496) to control parameters and components of the processing platform 400.

The support circuits 498 are coupled to the CPU 496 for supporting the processor in a conventional manner. These circuits include cache, power supplies, clock circuits, input/output circuitry and subsystems, and the like. One or more processes may be stored in the memory 498 as software routine that, when executed or invoked by the processor, causes the processor to control the operation of the processing platform 400 or individual processing chambers in the manner described herein. The software routine may also be stored and/or executed by a second CPU (not shown) that is remotely located from the hardware being controlled by the CPU 496.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 495 has one or more configurations to execute individual processes or sub-processes to perform the method. The controller 495 can be connected to and configured to operate intermediate components to perform the functions of the methods. For example, the controller 495 can be connected to and configured to control one or more of gas valves, actuators, motors, slit valves, vacuum control or other components.

In some embodiments, the controller 590 is connected to the motor 370 and is configured to align or level the support post 190. In some embodiments, the controller 590 is connected to a plurality of sensors configured to measure one or more of a process gap between a substrate and a shower head, a lift pin actuation plane, top surface planarity, support post 190 runout, support post 190 deflection due to vacuum, motor 370 deflection due to vacuum, support plate 320 deflection due to vacuum, and parallelism of a heater to a showerhead.

Additional embodiments of the disclosure are directed to methods of calibrating the processing chamber 100 under vacuum according to one or more embodiment of the disclosure is described. The method comprises the steps of: aligning a top surface of one or more substrate support surfaces 231 located within a interior volume 109 with a chamber lid 300 to establish a process gap, the one or more substrate support surfaces 231 connected to a support post 190 that extends through an opening 120 in the chamber floor 106 and an opening in a support plate 320 attached to a bottom surface 118 of the chamber floor 106; and creating a vacuum environment within the interior volume 109 causing the chamber floor 106 to deflect toward the interior volume 109 while maintaining the process gap. The process gap is between 1 mm and 2 mm.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A process chamber comprising:
   a chamber body having a chamber floor and sidewalls defining an interior volume, the chamber floor having a top surface and a bottom surface defining a thickness of the chamber floor and an opening through the thickness of the chamber floor;
   a support plate having a top surface and a bottom surface defining a support plate thickness, the top surface of the support plate in contact with the bottom surface of the chamber floor, the support plate having an opening extending through the support plate thickness and aligned with the opening through the thickness of the chamber floor;
   a support post extending through the support plate and the chamber floor, the support post having a rotational axis, a bottom end outside the interior volume and a top end inside the interior volume of the chamber body;
   a motor connected to the bottom surface of the support plate and configured to rotate the support post around the rotational axis and move the support post along a length of the rotational axis;
   a bellows configured to allow the support post to extend therethrough and separate a vacuum environment in the interior volume from an atmospheric environment outside the chamber body while allowing movement of the chamber floor; and
   at least one alignment pin configured to maintain positioning of the support plate relative to the chamber floor, each of the at least one alignment pin being disposed within an aperture formed in the top surface of the support plate and an aperture formed in the bottom surface of the chamber floor, the at least one alignment pin being positioned within an outer peripheral portion of the chamber floor, the outer peripheral portion of the chamber floor being substantially unaffected by deflection when the interior volume is under a vacuum environment.

2. The process chamber of claim 1, wherein the bellows is configured to allow the chamber floor to deflect under vacuum without affecting alignment of the support post.

3. The process chamber of claim 1, wherein the support post further comprises a plurality of support arms connected to the support post, each of the support arms having support pedestal with a substrate support surface.

4. The process chamber of claim 1, wherein there are at least three alignment pins.

5. The process chamber of claim 1, wherein the outer peripheral portion is defined as the outer 25% of a distance from a center of the opening in the chamber floor to the sidewalls.

6. The process chamber of claim 1, wherein when the interior volume is under a vacuum environment, a center portion of the chamber floor deflects toward the interior volume increasing a gap between the bottom surface of the chamber floor and the top surface of the support plate within the center portion, the gap remaining at atmospheric conditions.

7. The process chamber of claim 1, wherein the bellows comprises a top plate and a bottom plate, the top plate connected to the chamber floor and the bottom plate connected to one or more of the support plate or the motor.

8. The process chamber of claim 7, further comprising a bellows flange connected to the top plate of the bellows, the bellows flange having a diameter larger than a diameter of the top plate, the bellows flange connected to the top surface of the chamber floor.

9. The process chamber of claim 8, further comprising at least one O-ring between the bellows flange and one or more of the top surface of the chamber floor or the top plate of the bellows.

10. A processing method comprising:
aligning a top surface of one or more substrate support surfaces located within a chamber volume with a chamber lid to establish a process gap, the one or more substrate support surfaces connected to a support post that extends through an opening in a chamber floor and an opening in a support plate attached to a bottom surface of the chamber floor; and
creating a vacuum environment within the chamber volume causing a center portion of the chamber floor to deflect toward the chamber volume increasing a gap between the bottom surface of the chamber floor and a top surface of the one or more substrate support surfaces within the center portion, the gap remaining at atmospheric conditions.

11. The processing method of claim 10, wherein the process gap is between 1 mm and 2 mm.

12. The processing method of claim 10, wherein a motor is connected to the bottom surface of the support plate and configured to rotate the support post around a rotational axis of the support post and move the support post along a length of the rotational axis.

13. The processing method of claim 10, wherein a bellows configured to allow the support post to extend therethrough and separate the vacuum environment in the chamber volume from an atmospheric environment outside the chamber volume while allowing movement of the chamber floor.

14. The processing method of claim 13, wherein the bellows is configured to allow the chamber floor to deflect under vacuum without affecting alignment of the support post.

15. The processing method of claim 13, wherein at least one alignment pin configured to maintain positioning of the support plate relative to the chamber floor, each of the at least one alignment pin being disposed within an aperture formed in a top surface of the support plate and an aperture formed in a bottom surface of the chamber floor.

16. The processing method of claim 15, wherein the at least one alignment pin is positioned within an outer peripheral portion of the chamber floor, the outer peripheral portion of the chamber floor being substantially unaffected by deflection when the chamber volume is under a vacuum environment.

17. A process chamber comprising:
a chamber body having a chamber floor and sidewalls defining an interior volume, the chamber floor having a top surface and a bottom surface defining a thickness of the chamber floor and an opening through the thickness of the chamber floor;
a support plate having a top surface and a bottom surface defining a support plate thickness, the top surface of the support plate in contact with the bottom surface of the chamber floor, the support plate having an opening extending through the support plate thickness and aligned with the opening through the thickness of the chamber floor;
a support post extending through the support plate and the chamber floor, the support post having a rotational axis, a bottom end outside the interior volume and a top end inside the interior volume of the chamber body;
a motor connected to the bottom surface of the support plate and configured to rotate the support post around the rotational axis and move the support post along a length of the rotational axis;
a bellows configured to allow the support post to extend therethrough and separate a vacuum environment in the interior volume from an atmospheric environment outside the chamber body while allowing movement of the chamber floor; and,
a plurality of process stations located in the interior volume of the chamber body, the plurality of process stations being configured to perform one or more deposition processes;
wherein the bellows configured to allow the support post to extend therethrough and separate the vacuum environment in the interior volume from an atmospheric environment outside the chamber body while allowing movement of the chamber floor;
wherein the bellows is configured to allow the chamber floor to deflect under vacuum without affecting alignment of the support post;
wherein at least one alignment pin configured to maintain positioning of the support plate relative to the chamber floor, each of the at least one alignment pin being disposed within an aperture formed in a top surface of the support plate and an aperture formed in a bottom surface of the chamber floor;
wherein when the interior volume is under the vacuum environment, a center portion of the chamber floor deflects toward the interior volume increasing a gap between a bottom surface of the chamber floor and a top surface of the support plate within the center portion, the gap remaining at atmospheric conditions.

\* \* \* \* \*

UNITED STATES PATENT AND TRADEMARK OFFICE
CERTIFICATE OF CORRECTION

PATENT NO. : 11,501,957 B2
APPLICATION NO. : 17/011977
DATED : November 15, 2022
INVENTOR(S) : Gopu Krishna et al.

It is certified that error appears in the above-identified patent and that said Letters Patent is hereby corrected as shown below:

In the Specification

• Column 6, Line 1, replace "T." after "thickness" and before "The top" with "$T_P$".

Signed and Sealed this
Tenth Day of January, 2023

Katherine Kelly Vidal
*Director of the United States Patent and Trademark Office*